United States Patent
Sabri et al.

(10) Patent No.: US 10,847,647 B2
(45) Date of Patent: Nov. 24, 2020

(54) POWER SEMICONDUCTOR DEVICES HAVING TOP-SIDE METALLIZATION STRUCTURES THAT INCLUDE BURIED GRAIN STOP LAYERS

(71) Applicant: Cree, Inc., Durham, NC (US)

(72) Inventors: Shadi Sabri, Cary, NC (US); Daniel Lichtenwalner, Raleigh, NC (US); Edward Robert Van Brunt, Raleigh, NC (US); Scott Thomas Allen, Apex, NC (US); Brett Hull, Raleigh, NC (US)

(73) Assignee: Cree, Inc., Hickory, NC (US)

( * ) Notice: Subject to any disclaimer, the term of this patent is extended or adjusted under 35 U.S.C. 154(b) by 0 days.

(21) Appl. No.: 16/353,313

(22) Filed: Mar. 14, 2019

(65) Prior Publication Data

US 2020/0295174 A1    Sep. 17, 2020

(51) Int. Cl.
| | |
|---|---|
| H01L 29/78 | (2006.01) |
| H01L 29/16 | (2006.01) |
| H01L 29/423 | (2006.01) |
| H01L 29/66 | (2006.01) |
| H01L 29/739 | (2006.01) |
| H01L 29/08 | (2006.01) |

(52) U.S. Cl.
CPC ...... *H01L 29/7802* (2013.01); *H01L 29/0865* (2013.01); *H01L 29/1608* (2013.01); *H01L 29/42356* (2013.01); *H01L 29/66068* (2013.01); *H01L 29/7395* (2013.01)

(58) Field of Classification Search
CPC ............ H01L 29/7802; H01L 29/7395; H01L 29/1095
See application file for complete search history.

(56) References Cited

U.S. PATENT DOCUMENTS

| | | | |
|---|---|---|---|
| 2016/0020289 A1* | 1/2016 | Nakano | H01L 29/2003 257/77 |
| 2016/0260810 A1 | 9/2016 | Sakai | |

(Continued)

FOREIGN PATENT DOCUMENTS

JP    2008028079 A    2/2008

OTHER PUBLICATIONS

Notification of Transmittal of the International Search Report and the Written Opinion of the International Searching Authority, or the Declaration corresponding to International Application No. PCT/US2020/018730, dated Jul. 8, 2020, 23 pgs.

*Primary Examiner* — Changhyun Yi
(74) *Attorney, Agent, or Firm* — Myers Bigel, P.A.

(57) ABSTRACT

Semiconductor devices include a plurality of gate fingers extending on a wide bandgap semiconductor layer structure. An inter-metal dielectric pattern is formed on the gate fingers, the inter-metal dielectric pattern including a plurality of dielectric fingers that cover the respective gate fingers. A top-side metallization is provided on the inter-metal dielectric pattern and on exposed portions of the upper surface of the wide bandgap semiconductor layer structure. The top-side metallization includes a first conductive diffusion barrier layer on the inter-metal dielectric pattern and on the exposed portions of the upper surface of the wide bandgap semiconductor layer structure, a conductive contact layer on an upper surface of the first conductive diffusion barrier layer, and a grain stop layer buried within the conductive contact layer.

28 Claims, 7 Drawing Sheets

(56) References Cited

U.S. PATENT DOCUMENTS

2017/0222009 A1    8/2017   Hikasa et al.
2019/0058048 A1    2/2019   Goto et al.
2019/0189756 A1*   6/2019   Okumura ............ H01L 29/0882

* cited by examiner

POWER SEMICONDUCTOR DEVICES HAVING TOP-SIDE METALLIZATION STRUCTURES THAT INCLUDE BURIED GRAIN STOP LAYERS

FIELD

The present invention relates to semiconductor devices and, more particularly, to power semiconductor devices.

BACKGROUND

Power semiconductor devices are used to carry large currents and support high voltages. A wide variety of power semiconductor devices are known in the art including, for example, power Metal Oxide Semiconductor Field Effect Transistors ("MOSFETs"), bipolar junction transistors ("BJTs"), Insulated Gate Bipolar Transistors ("IGBTs"), Schottky diodes, Junction Barrier Schottky ("JBS") diodes, merged p-n Schottky ("MPS") diodes, Gate Turn-Off Thyristors ("GTOs"), MOS-controlled thyristors and various other devices. These power semiconductor devices are generally fabricated from wide bandgap semiconductor materials such as silicon carbide or gallium nitride based materials (herein, the term "wide bandgap semiconductor" encompasses any semiconductor having a bandgap of at least 1.4 eV). Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential.

Power semiconductor devices can have a lateral structure or a vertical structure. In a device having a lateral structure, the terminals of the device (e.g., the drain, gate and source terminals for a power MOSFET) are on the same major surface (i.e., upper or lower) of a semiconductor layer structure. In contrast, in a device having a vertical structure, at least one terminal is provided on each major surface of the semiconductor layer structure (e.g., in a vertical MOSFET, the source and gate may be on the upper surface of the semiconductor layer structure and the drain may be on the bottom surface of the semiconductor layer structure). Vertical structures are typically used in very high power applications, as the vertical structure allows for a thick semiconductor drift layer that can support high current densities and block high voltages. Herein, the term "semiconductor layer structure" refers to a structure that includes one or more semiconductor layers such as semiconductor substrates and/or semiconductor epitaxial layers.

A conventional silicon carbide power device typically has a silicon carbide substrate, such as a silicon carbide wafer, on which an epitaxial layer structure is formed. This epitaxial layer structure (which may comprise one or more separate layers) functions as a drift region of the power semiconductor device. The device typically includes an "active region" which includes one or more power semiconductor devices that have a p-n junction and/or a Schottky junction. The active region may be formed on and/or in the drift region. The active region acts as a main junction for blocking voltage in the reverse bias direction and providing current flow in the forward bias direction. The power semiconductor devices may have a unit cell structure in which the active region of each power semiconductor device includes a large number of individual "unit cell" devices that are electrically connected in parallel to function as a single power semiconductor device. In high power applications, such a device may include thousands or tens of thousands of unit cells.

SUMMARY

Pursuant to embodiments of the present invention, semiconductor devices are provided that include a wide bandgap semiconductor layer structure, and a top-side metallization on the upper surface of the wide bandgap semiconductor layer structure. The top-side metallization includes a first conductive diffusion barrier layer on the upper surface of the wide bandgap semiconductor layer structure, a conductive contact layer on an upper surface of the first conductive diffusion barrier layer, and a grain stop layer buried within the conductive contact layer.

In some embodiments, the semiconductor device may further include a plurality of gate fingers extending on the wide bandgap semiconductor layer structure, an inter-metal dielectric pattern on the gate fingers, the inter-metal dielectric pattern including a plurality of dielectric fingers that cover the respective gate fingers, the inter-metal dielectric pattern including openings. For example, the semiconductor device may be a MOSFET having a plurality of source regions in the semiconductor layer structure. In such embodiments, the conductive contact layer is a source contact layer that is on a first side of the semiconductor layer structure and that is electrically connected to the source regions, and the semiconductor device further includes a drain contact on a second side of the semiconductor layer structure that is opposite the first side. In other embodiments, the semiconductor device may comprise an IGBT or a HEMT.

In some embodiments, the grain stop layer may be a second conductive diffusion barrier layer. In such embodiments, the second conductive diffusion barrier layer may include titanium.

In some embodiments, the grain stop layer may have a non-planar upper surface.

In some embodiments, the grain stop layer may be a thin metal oxide layer.

In some embodiments, the grain stop layer may be buried within an upper 30% of the source contact layer. In some embodiments, at least portions of the grain stop layer may be within 1 micron from an upper surface of the source contact layer.

In some embodiments, the grain stop layer may be a discontinuous layer.

In some embodiments, the grain stop layer may be a first grain stop layer and the semiconductor device may further include a second grain stop layer that is also buried within the conductive contact layer. In some embodiments, the first grain stop layer may be a continuous grain stop layer and the second grain stop layer may be a discontinuous grain stop layer. In other embodiments, the first and second grain stop layers may each comprise continuous grain stop layers or may each comprise discontinuous grain stop layers.

The grain stop layer may divide the source contact layer into a lower portion and an upper portion. In some embodiments, both the lower portion and the upper portion of the source contact layer may have an average thickness of at least 1.5 microns and may be formed of the same material(s).

Pursuant to further embodiments of the present invention, semiconductor devices are provided that include a wide bandgap semiconductor layer structure having a plurality of source regions in an upper surface thereof, a plurality of gate fingers extending on the wide bandgap semiconductor layer structure, a contact layer on the wide bandgap semiconductor layer structure, and a grain stop layer buried within the contact layer, the grain stop layer having a non-planar upper surface. In some embodiments, the contact layer may be a source contact layer.

In some embodiments, the semiconductor device may further comprise an inter-metal dielectric pattern on the gate fingers, the inter-metal dielectric pattern including a plurality of dielectric fingers that cover the respective gate fingers, the inter-metal dielectric pattern including openings. In some embodiments, the grain stop layer may be a conductive diffusion barrier layer. In some embodiments, the conductive diffusion barrier layer may include titanium.

In some embodiments, the conductive diffusion barrier layer may be a second conductive diffusion barrier layer and the semiconductor device may further include a first conductive diffusion barrier layer that is conformally formed on the inter-metal dielectric pattern and on the semiconductor layer structure so that the first conductive diffusion barrier layer is between the inter-metal dielectric pattern and the source contact layer.

In some embodiments, the conductive diffusion barrier layer may be buried within an upper 30% of the source contact layer and/or may be within 1 micron from an upper surface of the source contact layer.

In some embodiments, the conductive diffusion barrier layer divides the source contact layer into a lower portion and an upper portion, and both the lower portion and the upper portion of the source contact layer have an average thickness of at least 1.5 microns and are formed of aluminum.

Pursuant to still further embodiments of the present invention, methods of fabricating a semiconductor device are provided in which a wide bandgap semiconductor layer structure is formed. A metal pattern is then formed on an upper surface of the wide bandgap semiconductor layer structure. An inter-metal dielectric pattern is formed on the metal pattern, the inter-metal dielectric pattern including openings that expose the upper surface of the wide bandgap semiconductor layer structure. A first conductive diffusion barrier layer is formed on the inter-metal dielectric pattern and on the exposed upper surface of the wide bandgap semiconductor layer structure. A first portion of a contact layer is formed on an upper surface of the first conductive diffusion barrier layer, the first portion of the contact layer comprising a first material. A grain stop layer is formed on the first portion of the contact layer. A second portion of the contact layer is formed on an upper surface of the grain stop layer, the second portion of the contact layer comprising the first material. A process that includes wet etchants may then (optionally) be performed on the second portion of the source contact layer.

In some embodiments, forming the grain stop layer on the first portion of the source contact layer may comprise forming a conductive diffusion barrier layer on the first portion of the source contact layer.

In some embodiments, forming the grain stop layer on the first portion of the source contact layer may comprise forming a discontinuous material layer on the first portion of the source contact layer, the discontinuous material layer including a metal that is different than any metal included in the source contact layer.

In some embodiments, forming the grain stop layer on the first portion of the source contact layer may comprise interrupting growth of the source contact layer in order to allow an upper surface of the first portion of the source contact layer to oxidize. In some such embodiments, oxygen may be injected into a growth apparatus immediately before and/or during the interruption of the growth of the source contact layer.

In some embodiments, the grain stop layer may be a first grain stop layer, and a second grain stop layer may be formed that is buried within the source contact layer.

In some embodiments, a drain contact may be formed on a lower surface of the wide bandgap semiconductor layer structure.

In some embodiments, the upper surface of the grain stop layer may be non-planar.

In some embodiments, a thickness of the first portion of the source contact layer may be at least twice a thickness of the second portion of the source contact layer.

DETAILED DESCRIPTION

Figure 1:
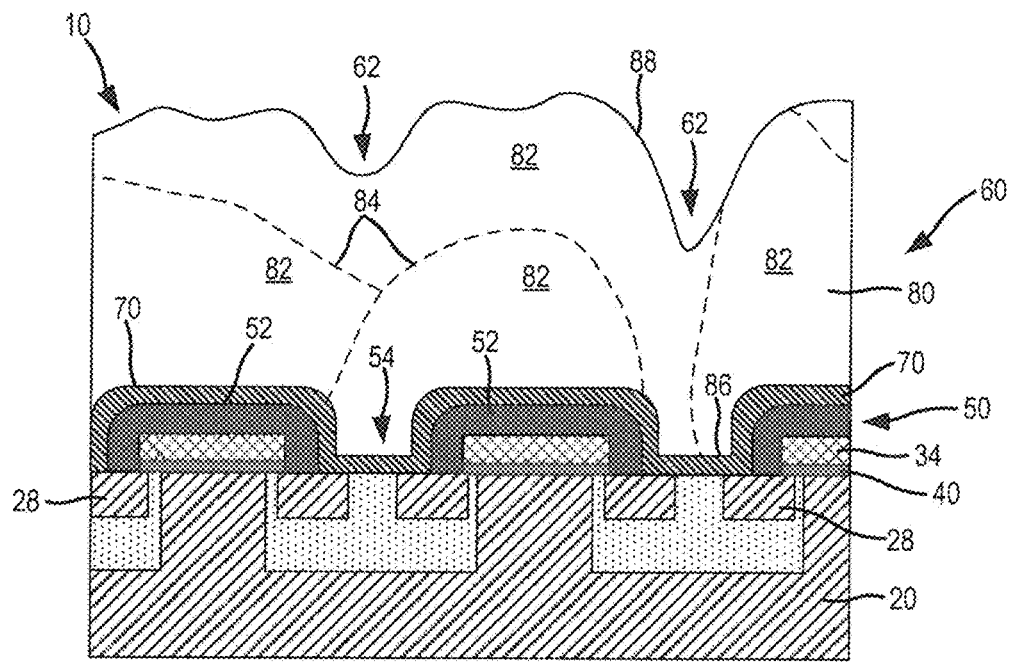
FIG. 1 is a schematic cross-sectional view of the top-side metallization structure for several unit cells of a conventional power MOSFET.

Power semiconductor devices such as, for example power MOSFETs and IGBTs, typically include a top-side metallization structure that is used to connect terminals of the device to external structures. For example, a power MOSFET having a vertical structure includes a semiconductor layer structure, a top-side source metallization structure that acts as the source terminal of the device, a top-side gate metallization structure that acts as the gate terminal of the device, and a "back-side" drain metallization structure that acts as the drain terminal of the device. FIG. 1 is a schematic cross-sectional view of a conventional power MOSFET 10 that shows the top-side source metallization structure of several unit cells.

As shown in FIG. 1, the conventional power MOSFET 10 includes a semiconductor layer structure 20 and a top-side source metallization structure 60 that is formed on the upper surface of the semiconductor layer structure 20. Only the upper portion of the semiconductor layer structure 20 is shown in FIG. 1 to simplify the figure. The semiconductor layer structure 20 may comprise, for example, a silicon carbide semiconductor substrate and/or one or more silicon carbide layers that are epitaxially grown thereon. Source regions 28 are formed in the upper surface of the semiconductor layer structure 20. While not shown in FIG. 1, a drain contact is formed on the lower surface of the semiconductor layer structure 20.

A plurality of gate fingers 34 are formed on an upper surface of the semiconductor layer structure 20. Each gate finger 34 may comprise a bar-shaped metal pattern, and the gate fingers 34 may extend in parallel to each other. A gate insulating pattern 40 is formed between each gate finger 34 and the upper surface of the semiconductor layer structure 20 to insulate the gate fingers 34 from the semiconductor layer structure 20. The gate insulating pattern 40 may comprise a patterned silicon oxide layer. An inter-metal dielectric pattern 50 that includes a plurality of dielectric fingers 52 is formed on the upper surface of the semiconductor layer structure 20 after formation of the gate fingers 34. Each dielectric finger 52 may cover the sidewalls and upper surface of a respective one of the gate fingers 34. Gaps 54 are provided between adjacent dielectric fingers 52 that expose the source regions 28 in the upper surface of the semiconductor layer structure 20. The pitch between adjacent dielectric fingers 52 may be quite small, and hence the gaps 54 have corresponding narrow widths such as, for example, 1-5 microns.

The top-side source metallization structure 60 includes a conductive diffusion barrier layer 70 and a source contact metal layer 80. The conductive diffusion barrier layer 70 may be formed conformally on the inter-metal dielectric pattern 50 and the exposed source regions 28 in the upper surface of the semiconductor layer structure 20. The conductive diffusion barrier layer 70 may be designed to prevent materials such as, for example, wet etchants from diffusing into the inter-metal dielectric pattern 50.

The source contact layer 80 may comprise a high conductivity metal layer. It is generally desirable that the source contact layer 80 have a smooth upper surface, as this may increase the likelihood that wet etchants or other materials that are applied to the device 10 during later processing steps can be completely rinsed off the device. However, in practice, for some power semiconductor devices it may not be practical, or even possible, to obtain such a smooth upper surface. As discussed above, in silicon carbide power devices, the width of each gap 54 may be very narrow such as on the order of 1-5 microns. The gaps 54 may also have a height-to-width aspect ratio that is greater than two. As the top-side source metallization structure 60 is deposited, the gaps 54 are filled, but deep recesses that are commonly referred to as keyholes 62 are typically formed in the top-side source metallization structure 60 in the regions above the gaps 54. Moreover, in practice, not every one of the gaps 54 may be completely filled, and hence small voids (not shown) may be present within the top-side source metallization structure 60.

In many cases, wet chemistry such as wet etching may be performed on the MOSFET 10 after the top-side source metallization structure 60 has been formed. It may be very difficult to completely rinse away wet etchants that are used in such wet chemistry after the wet chemistry processing steps are completed. This is particularly true in devices such as the MOSFET 10 that have non-planar upper surfaces that include deep keyholes 62 and/or pinholes. If wet etchants or other corrosive materials are not fully washed away, they may penetrate the upper surface of the source contact layer 80. The wet etchants may eat away at the source contact layer 80 and, more importantly, diffuse deep into the top-side source metallization structure 60 if diffusion paths exist within the source contact layer 80. If the chemicals penetrate through the top-side source metallization structure 60, they can attack the inter-metal dielectric pattern 50. If this occurs, an electrical short may form between a gate finger 34 and the top-side source metallization structure 60. Such an electrical short will electrically connect a source contact for the device (which may be a portion of the source contact layer 80 or a separate metal layer that is electrically connected to the source contact layer 80) to a gate contact (not shown) that is electrically connected to the gate fingers 34. The formation of such an electrical short in even a single unit cell may result in damage or the destruction of the MOSFET 10. While such electrical shorts may only occur rarely, given the large number of unit cell transistors in a device 10 even a failure rate of 1 in 1,000,000 may be unacceptable.

The source contact layer 80 may be a metal layer (e.g., aluminum) that is deposited at high temperature (e.g., 475° C.) so that the metal will be less viscous and will better fill the gaps 54 without forming voids. However, the high temperature deposition is also conducive to forming single-crystalline material. Consequently, as shown in FIG. 1, the source contact layer 80 may have large metal grains 82 that define grain boundaries 84 therebetween. Due to the single-crystalline structure, the grain boundaries 84 may extend completely through the source contact layer 80 (i.e., from the lower surface 86 of the source contact layer 80 that is adjacent the conductive diffusion barrier layer 70 to the upper surface 88 of the source contact layer 80). The grain boundaries 84 may act as diffusion paths for wet etchants or other corrosive materials. Moreover, since the grain boundaries 84 may extend most or even all of the way through the source contact layer 80, the grain boundaries 84 may allow the wet etchants to penetrate completely through the source contact layer 80. While the conductive diffusion barrier layer 70 will typically prevent wet etchants that reach the bottom of the source contact layer 80 from diffusing any farther, as noted above, small voids may be present in the conductive diffusion barrier layer 70 within the gaps 54. These voids represent defects in the conductive diffusion barrier layer 70 that may provide diffusion paths therethrough. The wet etchants may then "eat" their way through the inter-metal dielectric pattern 50 to generate an electrical short circuit between the top-side source metallization structure 60 and a gate finger 34. Thus, the post-metallization wet chemistry in combination with defects in the conductive diffusion barrier layer 70 (e.g., due to poor fill within the small gaps 54) and the large grain boundaries 84 in the source contact layer 80 may allow wet etchants to, on occasion, penetrate the top-side source metallization structure 60 to reach the inter-metal dielectric pattern 50. As noted above, this can be a potential failure mechanism in many high power semiconductor devices.

Pursuant to embodiments of the present invention, power semiconductor devices are provided that include top-side metallization structures that each have at least one grain stop layer buried therein. The buried grain stop layer may comprise, for example, a conductive diffusion barrier layer that is formed in a central or upper portion of the top-side metallization structure, although a buried grain stop layer may alternatively or additionally be formed in a lower portion of the top-side metallization structure. The buried grain stop layer may halt the growth of individual grains in the metal of the top-side metallization structure and may serve as a nucleation site for new grains, and hence may reduce the size of the individual grains in the top-side metallization structure. As a result, the grain stop layer may reduce or even eliminate grain boundaries that extend most or even all of the way through the top-side metallization structure. The smaller grain sizes may also be advantageous for certain subsequent chemical processes such as, for example, subsequent plating process. In some embodiments, the grain stop layer may comprise a second conductive diffusion barrier layer that may provide an additional barrier for preventing wet etchants from penetrating through the top-side metallization structure. The buried grain stop layer may be formed in a middle portion of a metal layer of the top-side metallization structure and hence the metal layer may be on both the lower side and the upper side of the grain stop layer. The buried grain stop layer may greatly reduce the likelihood that wet etchants or other corrosive materials may diffuse completely through the top-side metallization where it can possibly cause device failure. In some embodiments, the grain stop layer may be formed near the upper surface of the top-side metallization structure, such as, for example, within the top 15% of the source contact layer.

In some embodiments, the power semiconductor device may be a power MOSFET that includes a plurality of gate fingers that extend on an upper surface of a wide bandgap semiconductor layer structure. An inter-metal dielectric pattern is formed on the gate fingers, the inter-metal dielectric pattern including a plurality of dielectric fingers that cover the respective gate fingers. Openings in the inter-metal dielectric pattern expose portions of the upper surface of the wide bandgap semiconductor layer structure. A top-side source metallization structure is provided on the inter-metal dielectric pattern and on the exposed portions of the upper surface of the wide bandgap semiconductor layer structure. The top-side source metallization structure includes a first conductive diffusion barrier layer on the inter-metal dielectric pattern and on the exposed portions of the upper surface of the wide bandgap semiconductor layer structure, a source contact layer on an upper surface of the first conductive diffusion barrier layer, and a grain stop layer buried within the source contact layer.

The grain stop layer may divide the source contact layer into a lower portion and an upper portion. The lower portion of the source contact layer may have a thickness of at least 0.5 microns in some embodiments. In other embodiments, the thickness of the lower portion of the source contact layer may be at least 1.0 microns, at least 1.5 microns, at least 2.0 microns, at least 2.5 microns, or at least 3.0 microns. The upper portion of the source contact layer may also have a thickness of at least 0.5 microns in some embodiments. In other embodiments, the thickness of the upper portion of the source contact layer may be at least 1.0 microns, at least 1.5 microns, at least 2.0 microns, at least 2.5 microns, or at least 3.0 microns. The lower and upper portions of the source contact layer consist of the same materials. For example, the lower portion of the source contact layer may comprise a layer of nickel, titanium, tungsten and/or aluminum (and/or alloys and/or thin layered stacks of these and/or similar materials) having an average thickness of at least 1.0, 1.5, 2.0, 2.5 or 3.0 microns and the upper portion of the source contact layer may comprise a layer of nickel, titanium, tungsten and/or aluminum (and/or alloys and/or thin layered stacks of these and/or similar materials) having an average thickness of at least 1.0, 1.5, 2.0, 2.5 or 3.0 microns.

In some embodiments, the grain stop layer may have a non-planar upper surface and/or a non-planar lower surface. In other words, the grain stop layer may be a conformal layer that follows the contours of a non-planar upper surface of a lower portion of the source contact layer. The non-planar upper surface of the grain stop layer may facilitate creating nucleation sites for new grains and hence may contribute to an overall reduction in the grain sizes and in the lengths of the grain boundaries. The grain stop layer may comprise, for example, a continuous conductive diffusion barrier layer, a discontinuous material layer and/or a thin oxide layer that may be formed by oxidizing an interior portion of the source contact layer during growth.

While the discussion herein focuses on power semiconductor devices that include source contacts such as MOSFET, IGBT or HEMT devices, it will be appreciated that the techniques disclosed herein are not limited to such devices. In particular, diodes, BJTs, GTOs and the like may also benefit from the techniques disclosed herein.

Embodiments of the present invention will now be discussed in further detail with reference to FIGS. 2-8, in which example embodiments of the invention are shown.

Figure 2:
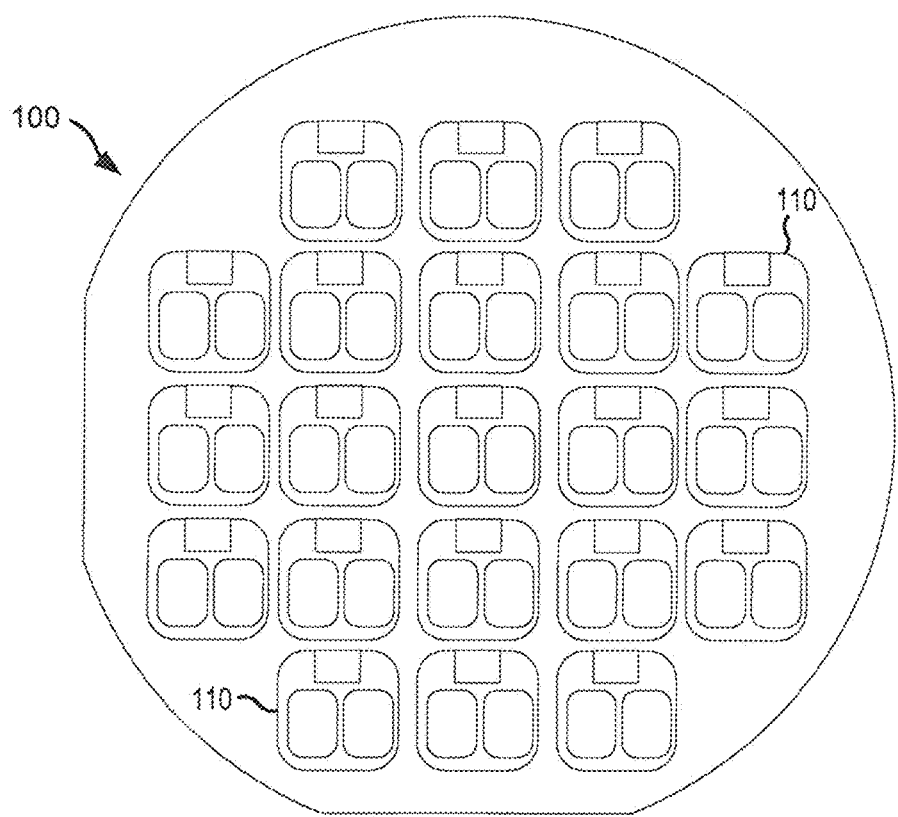
FIG. 2 is a schematic plan view of a semiconductor wafer that includes a plurality of power MOSFETs according to embodiments of the present invention.

FIG. 2 is a schematic plan view of a semiconductor wafer 100 that includes a plurality of power MOSFETs 110 according to embodiments of the present invention. The power MOSFETs 110 may be formed in rows and columns and may be spaced apart from each other so that the wafer 100 may later be singulated (e.g., diced) to separate the individual power MOSFETs 110 for packaging and testing. The wafer 100 may comprise, for example, a 4H silicon carbide substrate having one or more silicon carbide layers formed thereon (e.g., by epitaxial growth) in some embodiments. Other semiconductor layers (e.g., polysilicon layers), insulating layers and/or metal layers may be formed on the silicon carbide semiconductor layer structure to form the power MOSFETs 110. In some cases, the silicon carbide substrate may be thinned or even removed after other semiconductor layers are formed thereon.

Figure 3A:
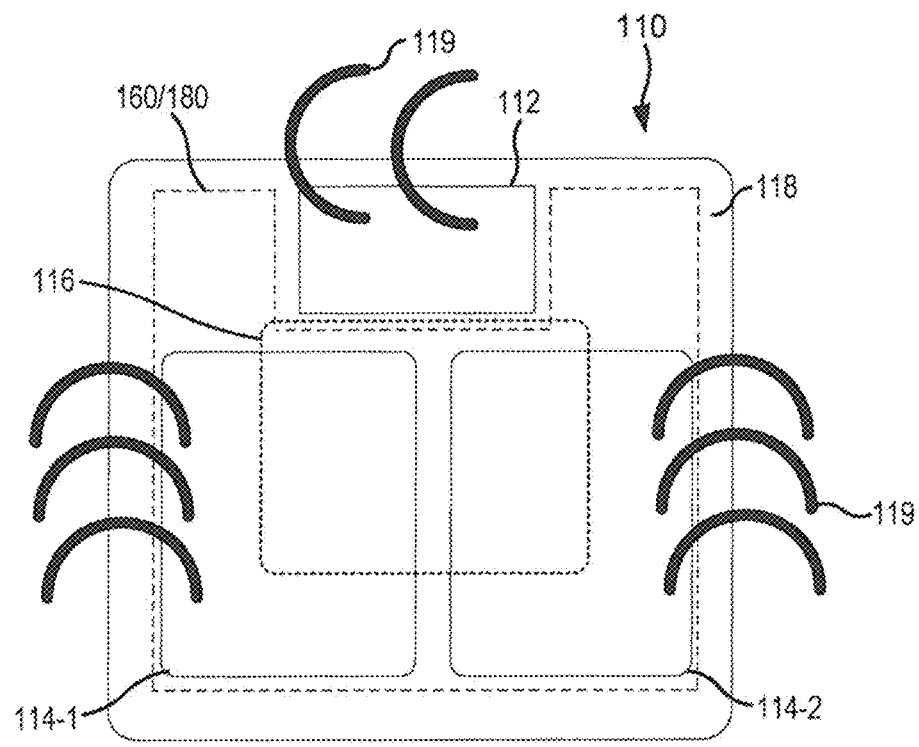
FIG. 3A is a schematic plan view of one of the power MOSFETs included on the semiconductor wafer of FIG. 2.
Figure 3B:
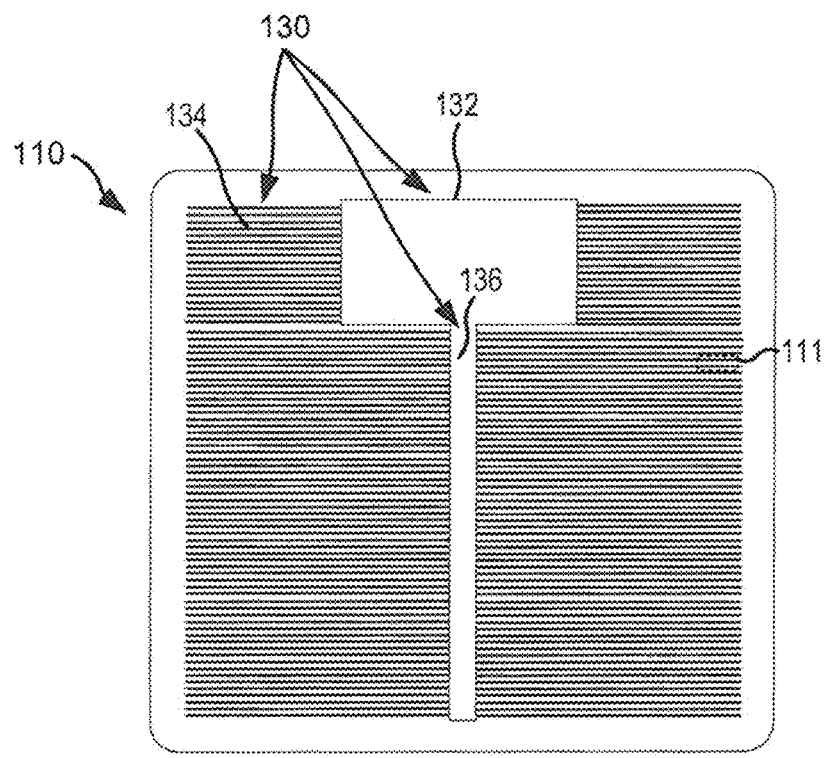
FIG. 3B is a schematic plan view of the power MOSFET of FIG. 3A with the top-side source metallization structure, the gate bond pad and the inter-metal dielectric pattern thereof omitted.

FIG. 3A is a schematic plan view of one of the power MOSFETs 110 included on the semiconductor wafer 100 of FIG. 2. FIG. 3B is a schematic plan view of the power MOSFET 110 of FIG. 3A with the top-side source metallization structure, the gate bond pad, and the inter-metal dielectric pattern thereof omitted.

As shown in FIG. 3A, a gate bond pad 112 and one or more source bond pads 114-1, 114-2 may be formed on an upper surface of a semiconductor layer structure 120 of the MOSFET 110. A drain bond pad 116 (shown as a dotted box in FIG. 3A) may be provided on the bottom side of the MOSFET 110. Each bond pad 112, 114, 116 may be formed of a metal, such as aluminum, that bond wires can be readily attached to via conventional techniques such as thermocompression or soldering.

As will be discussed in more detail below, the MOSFET 110 includes a top-side metallization structure 160 that electrically connects the source regions 128 in the semiconductor layer structure 120 of the MOSFET 110 to an external device. The top-side metallization structure 160 is indicated by a dashed box in FIG. 3A as significant portions of the top-side metallization structure 160 are covered by a protective layer 118 such as a polyimide layer. The source bond pads 114-1, 114-2 may be portions of the top-side metallization structure 160 that are exposed through openings in the protective layer 118 in some embodiments. Bond wires 119 are shown in FIG. 3A that may be used to connect the gate bond pad 112 and the source bond pads 114-1, 114-2 to external circuits or the like.

As is shown in FIG. 3B, a gate electrode pattern 130 may be provided that includes a gate pad 132, a plurality of gate fingers 134, and one or more gate buses 136 that electrically connect the gate fingers 134 to the gate pad 132. The gate electrode pattern 130 may comprise, for example, a polysilicon pattern in some embodiments, although metal or other conductive patterns could also be used. The gate pad 132 may be directly underneath and electrically connected to the gate bond pad 112 in some embodiments, and the gate fingers 134 may extend horizontally across the device. In other embodiments, the gate pad 132 may also serve as the gate bond pad 112. Other configurations are possible. An inter-metal dielectric pattern 150 (not shown in FIG. 3B, see FIG. 3C) may comprise a plurality of individual dielectric fingers 152 that cover the respective gate fingers 134 and gate bus(es) 136. The top-side source metallization structure 160 may be formed on the inter-metal dielectric pattern 150. The top-side source metallization structure 160 includes a conductive diffusion barrier layer 170, a source contact layer 180, and a grain stop layer 190 that is buried within the source contact layer 180. The MOSFET 110 includes a plurality of unit cell transistors 111 that are arranged in parallel. The location of portions of several adjacent unit cells 111 is shown in FIG. 3B to provide context.

Figure 3C:
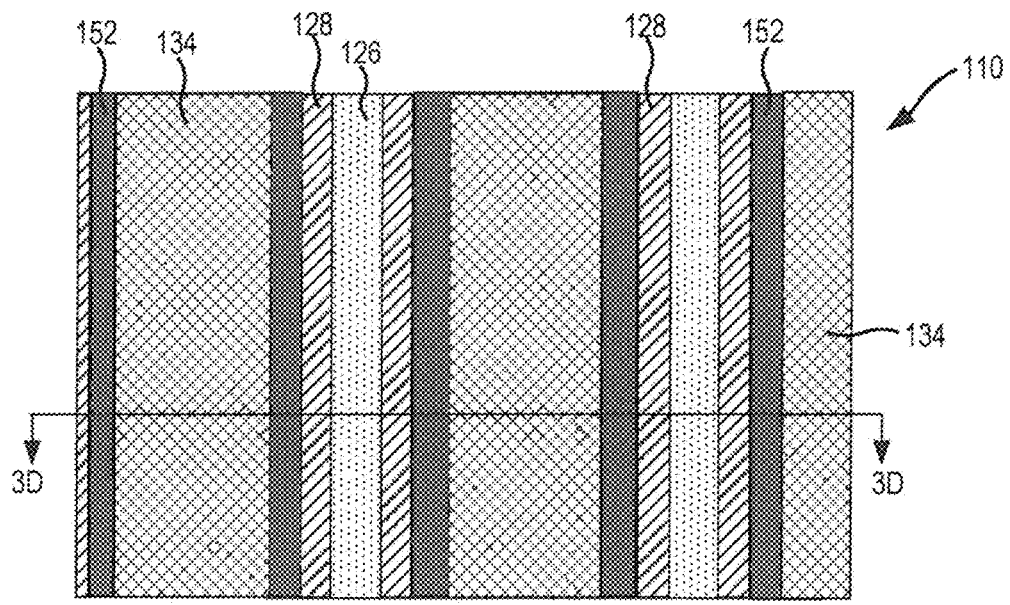
FIG. 3C is a schematic plan view of portions of several adjacent unit cells of the power MOSFET of FIG. 3B with the top-side source metallization structure and part of the inter-metal dielectric pattern omitted.
Figure 3D:
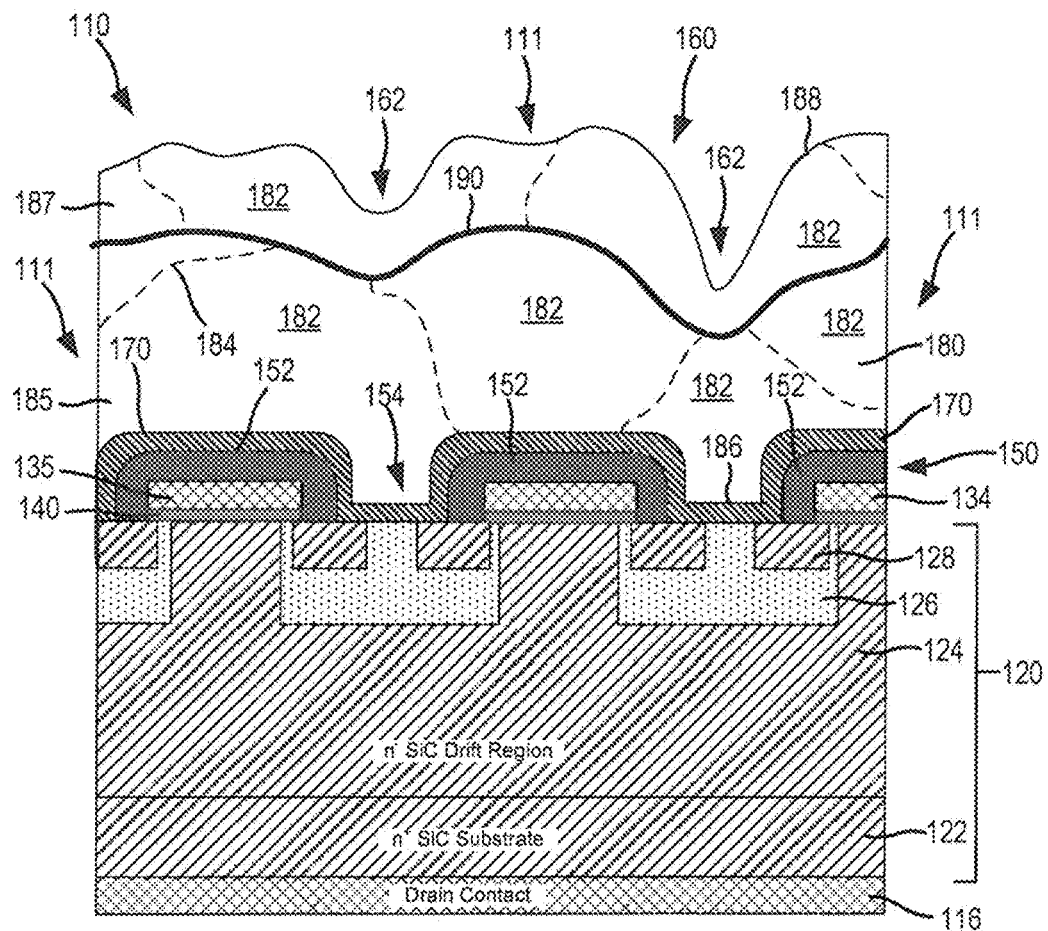
FIG. 3D is a schematic cross-sectional diagram taken along the line 3D-3D of FIG. 3C with the top-side source metallization structure and the remainder of the inter-metal dielectric pattern added to the figure.

FIG. 3C is a schematic plan view of portions of several adjacent unit cells 111 of the power MOSFET 110 of FIG. 3B with the top-side source metallization structure 160 and the upper portion of each dielectric finger 152 of the inter-metal dielectric pattern 150 thereof omitted to show the underlying gate fingers 134. FIG. 3D is a schematic cross-sectional diagram taken along the line 3D-3D of FIG. 3C with the top-side source metallization structure 160 and the remainder of the inter-metal dielectric pattern 150 added to the figure. It will be appreciated that FIGS. 3C and 3D illustrates one full unit cell 111 and portions of two additional unit cells 111 on either side thereof in order to provide context.

Referring to FIGS. 3C-3D, the unit cell transistor 111 may be formed on an n-type silicon carbide semiconductor substrate 122 such as, for example, a single crystal 4H silicon carbide semiconductor substrate that is heavily-doped (e.g., between $1\times10^{th}$ atoms/cm$^3$ and $1\times10^{21}$ atoms/cm$^3$) with n-type impurities. Herein, the "doping concentration" of a semiconductor material refers to the number of dopant atoms that cause the semiconductor material to have a certain conductivity type (i.e., either n-type or p-type) that are present within a cubic centimeter of semiconductor material as measured using standard measurement techniques such as Secondary Ion Mass Spectrometry ("SIMS"). The substrate 122 may have any appropriate thickness (e.g., between 100 and 500 microns thick), and may be partially or fully removed in some embodiments.

A drain contact may be formed on the lower surface of the semiconductor substrate 122. The drain contact may serve as both an ohmic contact to the semiconductor substrate 122 and as a drain bond pad 116 that provides an electrical connection between the drain terminal of the MOSFET 110 and external devices. In other embodiments, the drain contact may be separate from the drain bond pad 116 (e.g., a second layer may be formed on the drain contact that acts as the drain bond pad 116). In the depicted embodiment, a single metal layer 116 is formed on the lower surface of the semiconductor substrate 122 that acts as both an ohmic drain contact and as a drain bond pad. The drain contact/drain bond pad 116 may comprise, for example, metals such as nickel, titanium, tungsten and/or aluminum, and/or alloys and/or thin layered stacks of these and/or similar materials.

A lightly-doped n-type (n) silicon carbide drift region 124 is provided on an upper surface of the substrate 122. The n-type silicon carbide drift region 124 may, for example, be formed by epitaxial growth on the silicon carbide substrate 122. The n-type silicon carbide drift region 124 may have, for example, a doping concentration of $1\times10^{14}$ to $1\times10^{16}$ dopants/cm$^3$. The n-type silicon carbide drift region 124 may be a thick region, having a vertical height above the substrate 122 of, for example, 3-100 microns. While not shown in FIG. 3D, in some embodiments an upper portion of the n-type silicon carbide drift region 124 may be more heavily doped (e.g., a doping concentration of $1\times10^{16}$ to $5\times10^{16}$ dopants/cm$^3$) than the lower portion thereof to provide a current spreading layer in the upper portion of the n-type silicon carbide drift region 124.

P-type well regions 126 are formed in upper portions of the n-type drift region 124. Heavily-doped (n$^+$) n-type silicon carbide source regions 128 may then be formed in upper portions of the well regions 126 by, for example, ion implantation. Channel regions are formed in the sides of the well regions 126. The substrate 122, the drift region 124, the well regions 126 and the source regions 128 may together comprise the semiconductor layer structure 120 discussed above with reference to FIGS. 3A-3B.

After the n-type source regions 128 are formed, a gate insulating pattern 140 may be formed on the upper surface of the semiconductor layer structure 120. The gate insulating pattern 140 may comprise, for example, a silicon oxide pattern, a silicon nitride pattern, or a silicon oxynitride pattern, although other insulating materials may be used. Gate fingers 134 such as polysilicon gate fingers 134 are formed on the gate insulating pattern 140. The channel regions electrically connect the n-type source regions 128 to the drift region 124 when a sufficient bias voltage is applied to the gate fingers 134. When the bias voltage is applied to the gate fingers 134, current may flow from the n-type source regions 128 through the channel regions in the sides of the well regions 126 to the drift region 124 and down to the drain contact 116.

An inter-metal dielectric pattern 150 is formed that may comprise a plurality dielectric fingers 152 in the form of spaced-apart stripes of dielectric material. The inter-metal dielectric pattern 150 may comprise, for example, a silicon oxide layer, a silicon nitride layer, a combination of silicon oxide and silicon nitride layers or a reflowed boro-phospho-silicate-glass ("BPSG") pattern. Each dielectric finger 152 may cover the upper surface and sidewalls of a respective one of the gate fingers 134. The n-type source regions 128 are exposed in the gaps 154 between adjacent dielectric fingers 152. As discussed above, in silicon carbide power devices, the width of each gap 154 may be very narrow such as on the order of 1-5 microns. Moreover, as technologies continue to develop, the gaps 154 are becoming smaller, and gaps 154 as small as 0.5 microns may be realized in commercial devices in the near future. Such small gaps 154 may be difficult to fill with a top-side source metallization structure 160 (discussed below) without forming voids in the top-side source metallization structure 160.

A top-side source metallization structure 160 is formed on the inter-metal dielectric pattern 150 and on the exposed n-type source regions 128 in the semiconductor layer structure 120. The top-side source metallization structure 160 includes a conductive diffusion barrier layer 170, a source contact layer 180 and a grain stop layer 190 that is buried within the source contact layer 180. The conductive diffusion barrier layer 170 may be a metal or metal-containing layer that is relatively inert with respect to adjacent layers and that retards or substantially prevents diffusion of other materials therethrough. The conductive diffusion barrier layer 170 may comprise, for example, a continuous conductive layer that includes titanium, tungsten, tantalum, nickel, hafnium and/or indium. For example, the conductive diffusion barrier layer 170 may comprise titanium, tantalum, nickel, hafnium, tungsten, titanium nitride, tungsten nitride, indium oxide, or tantalum nitride. In one example embodiment, the conductive diffusion barrier layer 170 may be a titanium layer. The conductive diffusion barrier layer 170 may be formed conformally on the exposed portion of the semiconductor layer structure 120 (e.g., on the source regions 128) and on the inter-metal dielectric pattern 150. The conductive diffusion barrier layer 170 is typically formed of a metal that is less conductive than the metal included in the source contact layer 180. As such, the conductive diffusion barrier layer 170 may be a relatively thin layer in order to reduce the impact thereof on the resistance of the top-side source metallization structure 160. In some embodiments, the conductive diffusion barrier layer 170 may be omitted (and this is true not only with respect to the MOSFET 110 of FIGS. 3A-3D, but also with respect to each of the additional embodiments disclosed herein).

The source contact layer 180 may be conformally formed on the conductive diffusion barrier layer 170. The source contact layer 180 may comprise, for example, metals such as nickel, titanium, tungsten and/or aluminum, and/or alloys and/or thin layered stacks of these and/or similar materials. The source contact layer 180 may comprise an aluminum layer in some embodiments, as aluminum is relatively inexpensive, highly conductive, easy to deposit, and may act as a good seed layer for other metals. The source contact layer 180 may be substantially thicker than the conductive diffusion barrier layer 170. The thickness of the source contact layer 180 may reflect a trade-off between the resistance of the top-side source metallization structure 160 (which is desired to be low) and the depth of the keyholes 162 which tend to form in the portions of the source contact layer 180 that are above the source regions 128. Generally speaking, as a thickness of the source contact layer 180 is increased, the resistance of the source contact layer 180 is increased, while the average depth of the keyholes 162 is reduced.

When aluminum is used as the material for the source contact layer 180, a typical deposition temperature would be on the order of 450-475° C. While higher deposition temperatures could be used, the higher the deposition temperature, the larger the size of the grains 182 in the source contact layer 180. Thus, the deposition temperature may be intentionally set lower than necessary to reduce the grain size of the source contact layer 180. However, since embodiments of the present invention may use different, separate techniques to reduce the grain size, namely the provision of the grain stop layer 190, the deposition temperature may be increased to be between 475-550° C. in some embodiments, and between 500-550° C. in other embodiments, and between 510-540° C. in still further embodiments. The use of such higher deposition temperatures may improve the gap fill characteristics of the source contact layer 180, and hence may further reduce the device failure rate.

The grain stop layer 190 is buried within the source contact layer 180. In some embodiments, the grain stop layer 190 may comprise a second conductive diffusion barrier layer. In such embodiments, the grain stop layer 190 may comprise a continuous layer that contains one or more metals that tend to block the diffusion of other materials therethrough. In example embodiments where the grain stop layer 190 is implemented as a second conductive diffusion barrier layer, the grain stop layer 190 may comprise nickel, tantalum, titanium, hafnium, tungsten, titanium nitride, indium oxide, tungsten nitride, tantalum nitride and/or combinations thereof. The grain stop layer 190 may be chemically compatible with the material(s) used to form the source contact layer 180, and may be an electrically conductive layer. As will be discussed below, however, in other embodiments, the grain stop layer 190 may be an oxide layer that may not be particularly conductive, but may be thin enough that electrons will tunnel through the layer and hence the layer will not impede the overall conductivity of the top-side source metallization structure 160. The grain stop layer 190, when implemented as a second conductive diffusion barrier layer, may resist diffusion of wet etchants or other materials therethrough, and may also serve as a layer that interrupts the growth of grains in the source contact layer 180 so that new grains are formed on the upper side of the grain stop layer 190.

While it may be advantageous to configure the grain stop layer 190 as a second conductive diffusion barrier layer, embodiments of the present invention are not limited thereto. In particular, in other embodiments, the grain stop layer 190 may simply be a layer that is designed to break up the grains 182 in the source contact layer 180 by acting as a nucleation layer on which new grains form. In such embodiments, the grain stop layer 190 may merely serve to reduce the size of the grain boundaries 184 and, in particular, the number of grain boundaries that extend all the way from an upper surface 188 to a lower surface 186 of the source contact layer 180. This may reduce or eliminate long diffusion paths through the source contact layer 180 along which wet etchants or other corrosive materials may diffuse.

A grain stop layer 190 that is simply designed to break up the grains 182 in the source contact layer 180 may be formed, for example, by forming a thin layer of a different conductive material in a central or upper portion of the source contact layer 180, although the grain stop layer may alternatively be formed in a lower portion of the source contact layer. The conductive material used need not be a material that acts as a diffusion barrier layer, and/or the thin layer of the conductive material may be a discontinuous layer so that the layer will not operate as a conductive diffusion barrier layer. However, by forming a different material layer the growth of the grains in the source contact layer 180 material may be interrupted by the intervening thin grain stop layer 190. When growth of the source contact layer 180 is resumed, new grains of source contact material will nucleate on the upper surface of the grain stop layer 190. Thus, while the grain stop layer 190 may be a conductive diffusion barrier layer in some embodiments, it need not be.

The source contact layer 180 (including any grain stop layers 190 buried therein) may have an average height of X in the vertical direction (where "height" refers to the thickness of the layer in the direction perpendicular to the bottom surface of the substrate 122), and the average height of the grains 182 may be equal to Y. By way of example, the value X may be between 2.5 microns and 6.5 microns in some embodiments, may be between 3.0 and 6.0 microns in other embodiments, may be between 3.5 and 5.5 microns in still other embodiments, and may be between 4.0 and 5.0 microns in still further embodiments. By way of further example, the value Y may be less than 2.5 microns in some embodiments, less than 2.0 microns in other embodiments, less than 1.5 microns in further embodiments, less than 1.0 microns in other embodiments, and less than 0.5 microns in still further embodiments. In each of the above cases, the value of Y may be at least 0.1 microns in some cases. In some embodiments, the ratio of X/Y may be at least 1.5. In other embodiments, the ratio of X/Y may be at least 2.0. In still other embodiments, the ratio of X/Y may be at least 4.0. In yet further embodiments, the ratio of X/Y may be at least 8.0. Thus, it will be appreciated that a ratio of the average height of the source contact layer 180 (i.e., X) to an average height of the grains 182 in the source contact layer 180 may be at least 1.5, 2.0, 4.0 or 8.0 in various embodiments of the present invention, and may be less than 20 in some embodiments.

Moreover, as will be discussed in further detail with reference to the embodiment of FIG. 7, in some cases that grain stop layer 190 may be formed by simply adding a growth stop in the source contact layer 180 deposition process. During the growth stop oxygen that is in the growth apparatus may oxidize the exposed surface of the source contact layer 180 to form a thin metal oxide layer that interrupts the growth of grains 182 in the source contact layer 180 and that serves as a nucleation site for the growth of new grains 182.

In some embodiments, the grain stop layer 190 may be formed near the upper surface of the top-side source metallization structure 160, such as, for example, within the upper half of the average thickness of the source contact layer 180 in the vertical direction (i.e., in a direction perpendicular to the major surfaces of the semiconductor substrate 122). For example, in an example embodiment, the grain stop layer 190 may be formed in the upper 40% of the average thickness of the source contact layer 180. In still other embodiments, the grain stop layer 190 may be formed in the upper 30% or even within the upper 20% of the average thickness of the source contact layer 180. Having the grain stop layer 190 near the upper surface of the top-side source metallization structure 160 may help ensure that wet etchants or other harmful chemicals do not penetrate deep into the top-side source metallization structure 160. In terms of distance from the upper surface, in some embodiments the grain stop layer 190 may be, on average, within 2 microns of the upper surface of the source contact layer 180. In other embodiments, the grain stop layer 190 may be, on average, within 1.5 microns of the upper surface of the source contact layer 180. In still other embodiments, the grain stop layer 190 may be, on average, within 1 micron of the upper surface of the source contact layer 180.

In embodiments that include a single grain stop layer 190, the grain stop layer 190 may divide the source contact layer 180 into a lower portion 185 and an upper portion 187. The grain stop layer 190 may be formed conformally on the upper surface of the bottom portion 185 of the source contact layer 180. Since the source contact layer 180 is a non-planar layer, the grain stop layer 190 may likewise be a non-planar layer having a non-planar lower surface and a non-planar upper surface.

In some embodiments, the lower portion 185 of the source contact layer 180 may have a thickness of at least 0.5 microns in some embodiments. In other embodiments, the thickness of the lower portion 185 of the source contact layer 180 may be at least 1.0 microns, at least 2.0 microns, or at least 3.0 microns. The upper portion 187 of the source contact layer 180 may also have a thickness of at least 0.5 microns in some embodiments. In other embodiments, the thickness of the upper portion 187 of the source contact layer 180 may be at least 1.0 microns, at least 2.0 microns, or at least 3.0 microns. The lower and upper portions 185, 187 of the source contact layer 180 are formed of the same materials. In an example embodiment, the lower portion 185 of the source contact layer 180 may comprise an aluminum layer having an average thickness of at least 2.0 microns and the upper portion 187 of the source contact layer 180 may comprise an aluminum layer having an average thickness of at least 2.0 microns. As will be discussed below, in some embodiments of the present invention, more than one grain stop layer 190 may be buried within the source contact layer 180. In embodiments that include multiple buried grain stop layers 190, the lower portion 185 and/or the upper portion 187 of the source contact layer 180 may be subdivided into multiple parts.

After the grain stop layer 190 is formed, formation of the remainder (i.e., the upper portion 187) of the source contact layer 180 is completed in order to bury the grain stop layer 190 within the source contact layer 180. Thereafter, a plating process such as, for example, a Ni:Au electroless plating process may be performed on the exposed upper surface of the source contact layer 180 in order to form a nickel layer (not shown) followed by a gold layer (not shown) on the upper surface of the source contact layer 180. The nickel layer may be deposited via a sintering or soldering process and may serve as a contact to an external device and the gold layer may serve as a corrosion protection layer for the silver layer.

While the MOSFET 110 is an n-type device with the source contact layer 180 on an upper surface thereof and the drain contact 116 on the bottom surface thereof, it will be appreciated that in p-type devices these locations are reversed. Moreover, while the above described power MOSFET 110 and the other devices described herein are shown as being silicon carbide based semiconductor devices, it will be appreciated that embodiments of the present invention are not limited thereto. Instead, the semiconductor devices may comprise any wide bandgap semiconductor that is suitable for use in power semiconductor devices including, for example, gallium nitride based semiconductor devices and II-VI compound semiconductor devices. Additionally, while the example embodiments of the present invention that are described herein are power semiconductor devices, it will be appreciated that the metallization structures including grain stop layers disclosed herein may be used in any semiconductor device and not just in power semiconductor devices.

Thus, pursuant to embodiments of the present invention, power MOSFETs are provided that may be less susceptible to device failure due to gate-to-source electrical shorts due to the provision of grain stop layers 190 that reduce or eliminate diffusion paths through the source contact layer 180 and/or that provide additional barriers to diffusion. As such, the power MOSFETs according to embodiments of the present invention may have lower failure rates. In addition, the smaller sized grains 182 and reduced length grain boundaries 184 in the source contact layer 180 metal may be advantageous in later processing steps such as, for example, the above-described Ni:Au electroless plating process that may be performed on the upper surface of the source contact layer 180.

The problem addressed by the techniques according to embodiments of the present invention tends to be a problem that is specific to wide bandgap power semiconductor devices such as silicon carbide and/or gallium nitride based devices, for example. In such devices, the gaps 154 between adjacent dielectric fingers 152 may be much smaller than the corresponding gaps that are provided in MOSFETs formed in narrow bandgap semiconductor devices such as silicon based devices. As such, in silicon MOSFETs voids in the source contact layer do not tend to form in the gaps between adjacent dielectric fingers and any keyholes that form tend to be much shallower due to the much larger size of the gaps.

It should be noted that there are other potential ways to address the problem of corrosive materials diffusing through the top-side source metallization structure 60 of the conventional power MOSFET 10 discussed above with reference to FIG. 1. As one example, the aspect ratio of the gaps 54 may be reduced by, for example, enlarging the width of the source regions 28. This may improve the gap fill characteristics of the top-side source metallization structure 60. As another example, the size of the grains 82 in the source contact layer 80 may be reduced by controlling the deposition parameters (e.g., by reducing the deposition temperature, the grain size may be reduced). The grain size may also be impacted by the conditions of the cool down sequence after formation of the source contact layer 80. Likewise changes in the deposition parameters may be used to improve the gap fill characteristics of the material of the source contact layer 80 (e.g., increased deposition temperature may facilitate improved gap fill). Moreover, the gap fill characteristics may also be improved by using a high precision deposition apparatus. Additionally, other deposition techniques such as, for example, atomic layer deposition could be used to form portions of the source contact layer 80 (e.g., the portion in the gaps 54) in order to obtain more consistent coverage and to reduce or prevent voids.

Figure 4:
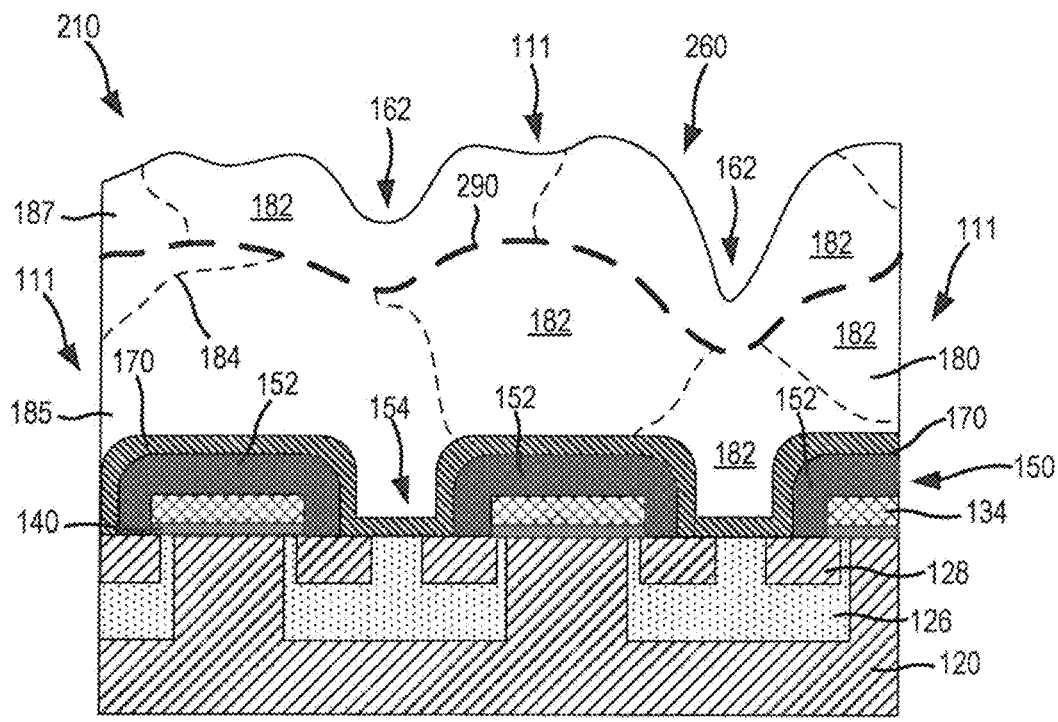
FIG. 4 is a schematic cross-sectional diagram illustrating a power MOSFET having a discontinuous grain stop layer according to further embodiments of the present invention.

FIG. 4 is a schematic cross-sectional diagram illustrating a power MOSFET 210 having a discontinuous grain stop layer according to further embodiments of the present invention. The power MOSFET 210 may be identical to the power MOSFET 110 discussed above except that the top-side source metallization structure 160 having a continuous grain stop layer 190 that is included in power MOSFET 110 is replaced with top-side source metallization structure 60 having a discontinuous grain stop layer 290 in power MOSFET 210.

As can be seen in FIG. 4, the grain stop layer 290 is a discontinuous layer that only forms in places on the upper surface of the bottom portion 185 of the source contact layer. The discontinuous grain stop layer 290 may be formed, for example, by various deposition techniques including, for example, sputtering, electron beam evaporation or atomic layer deposition. Because the grain stop layer 290 is discontinuous, it will typically not serve as an effective diffusion barrier layer. However, if formed properly, the grain stop layer 290 will interrupt the crystal growth in the source contact layer 180 and will serve as a nucleation site for new crystal growth, and hence the grain stop layer 290 will reduce or prevent the formation of long grain boundaries 184 in the source contact layer 180.

Figure 5:
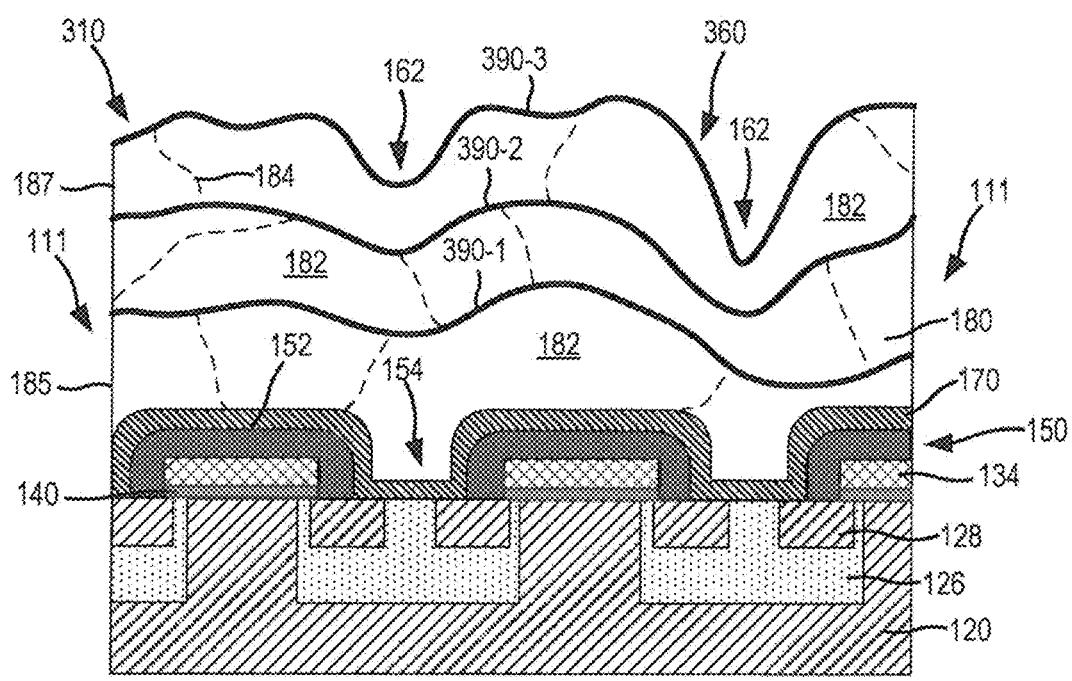
FIG. 5 is a schematic cross-sectional diagram illustrating a power MOSFET having a plurality of buried conductive diffusion barrier layers according to still further embodiments of the present invention.

FIG. 5 is a schematic cross-sectional diagram illustrating a power MOSFET 310 having a plurality of buried diffusion barrier layers according to still further embodiments of the present invention. The power MOSFET 310 may be identical to the power MOSFET 110 discussed above except that the power MOSFET 310 includes a top-side source metallization structure 360 having a plurality of grain stop layers 390-1 through 390-3. While a total of three grain stop layers 390 are shown in FIG. 5, it will be appreciated that in other embodiments two grain stop layers 390 or more than three grain stop layers 390 may be provided. Moreover, as is also shown in FIG. 5, the uppermost grain stop layer 390 may not be a buried layer in some embodiments, but instead may be formed on the upper surface of the source contact layer 180. It will be appreciated that each of the grain stop layers 390-1 through 390-3 may be any of the grain stop layers discussed above with respect to FIGS. 3A-3D. For example, some or all of the grain stop layers 390-1 through 390-3 may be conductive diffusion barrier layers formed of, for example, titanium or the other materials listed above, and/or some or all of the grain stop layers 390-1 through 390-3 may be discontinuous layers and/or thin metal oxide layers that are designed to interrupt grain growth so that new grains 182 of the metal of the source contact layer 180 will nucleate on the upper surfaces of the grain stop layers 390.

Figure 6:
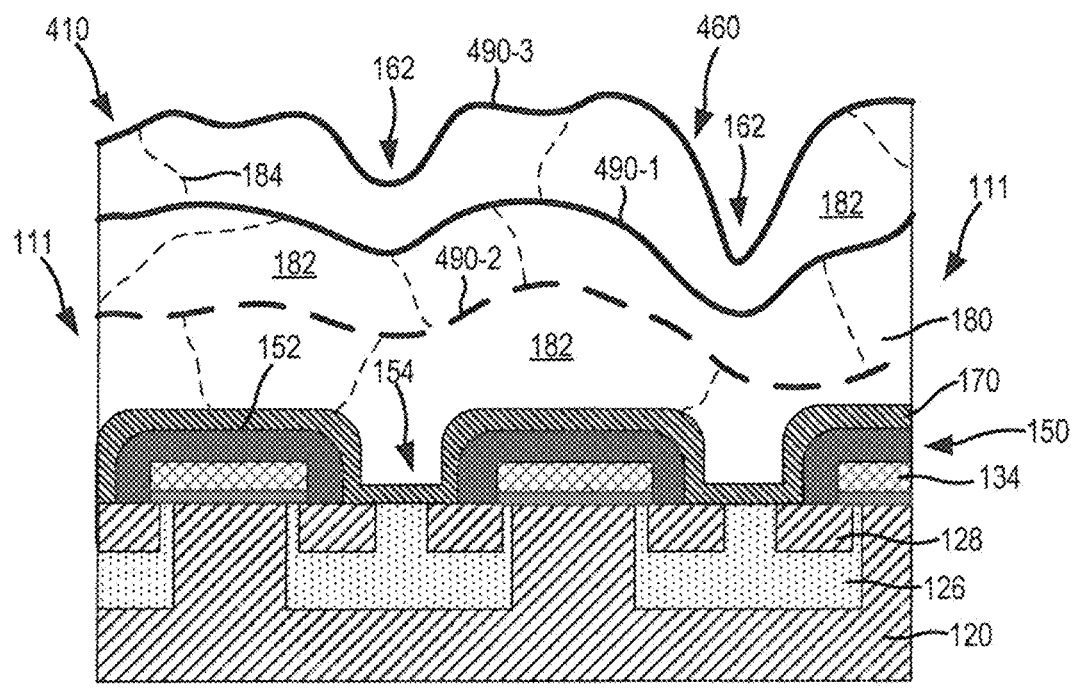
FIG. 6 is a schematic cross-sectional diagram illustrating a power MOSFET having at least one buried conductive diffusion barrier layer and at least one buried discontinuous grain stop layer according to additional embodiments of the present invention.

FIG. 6 is a schematic cross-sectional diagram illustrating a power MOSFET 410 having a plurality of grain stop layers 490 in the form of at least one buried diffusion barrier layer 490-1 and at least one buried discontinuous grain stop layer 490-2 according to additional embodiments of the present invention. The power MOSFET 410 may be identical to the power MOSFET 310 described above, except that at least one of the buried grain stop layers 490-2 in the top-side source metallization structure 460 may comprise a discontinuous layer. It will be appreciated that the order of the grain stop layers 490 may be changed from that which is shown on FIG. 6, and that any number of buried diffusion barrier layers 490-1 and buried discontinuous grain stop layers 490-2 may be included in the device.

Figure 7:
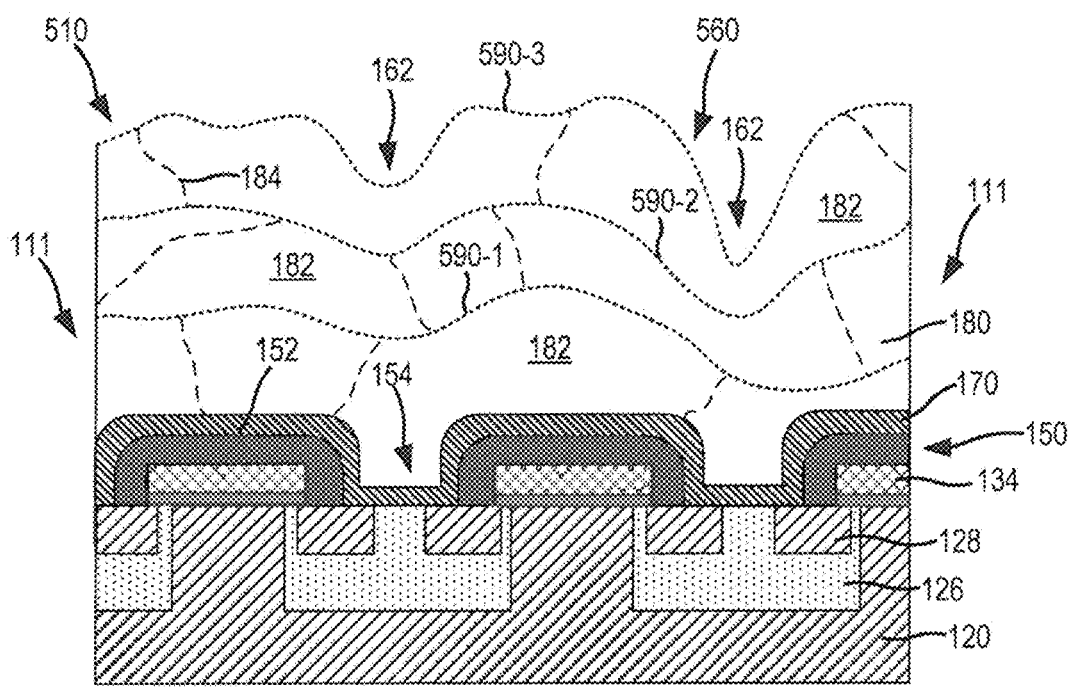
FIG. 7 is a schematic cross-sectional diagram illustrating a power MOSFET having a source contact layer that includes a plurality of buried oxide layers that act as grain stop layers according to yet additional embodiments of the present invention.

FIG. 7 is a schematic cross-sectional diagram illustrating a power MOSFET 510 according to still further embodiments of the present invention. As discussed above, in some cases, a grain stop layer 190 may be formed by simply adding a growth stop in the source contact layer 180 deposition process. For example, the metal used to form the source contact layer 180 may be deposited by sputtering or evaporation. The sputtering or evaporation process may be paused for a length of time to allow oxygen that is in the growth apparatus to oxidize the exposed surface of the source contact layer 180. A burst of oxygen may be injected into the growth chamber to speed up the oxidation process in some embodiments. If oxygen is added in this manner, the growth stop may be very short such as, for example, less than a second in length. The goal is to oxidize a very small thickness of the source contact layer 180 that is sufficient to break up existing grains in the source contact layer 180 and to form nucleation sites for the growth of new grains 182. While the oxidized metal may have a higher resistance than the metal of the source contact layer 180, the oxide layer that serves as the grain stop layer 190 may be formed to be sufficiently thin such that electrons will simply tunnel through the oxidized layer and hence the grain stop layer 190 will have little to no impact on operation of the device and/or on the resistivity of the top-side source metallization structure 160.

In the embodiment of FIG. 7, the MOSFET 510 has a top-side source metallization structure 560 that includes a plurality of buried grain stop layers 590 where each of the grain stop layers 590 is implemented by interrupting the growth of the source contact layer 180 to form thin metal oxide layers 590 that are buried within or on top of the source contact layer 180. The thin metal oxide layers act as grain stop layers 590 that do not serve as a diffusion barrier but which interrupt grain growth in the source contact layer 180 and serve as nucleation sites for new grains 182. Two, three, four, five, six, seven or more such thin metal oxide layers 590 may be formed within the grain stop layer 180. By forming a large number (e.g., four or more) of the thin metal oxide layers 590 the average size of the grains 182 in the source contact layer 180 may be reduced significantly. While not shown in FIG. 7, one or more buried conductive diffusion barrier layers can also be formed within the source contact layer 180, as may one or more discontinuous grain stop layers.

In any of the embodiments disclosed herein, the conductive diffusion barrier layer and/or the discontinuous grain stop layers may be formed of the same materials or may be formed of different materials. For example, in embodiments that include multiple conductive diffusion barrier layers, these layers may be formed of the same material (e.g., each layer may be a titanium layer) or may be formed of different materials (e.g., one layer is a titanium layer, another layer is a titanium nitride layer, another layer is a tantalum layer, etc.).

It will also be appreciated that each grain stop layer discussed above may comprise a single layer or may be a multilayer structure. In some cases, multilayer structures may be more effective either as a diffusion barrier and/or as a mechanism for interrupting grain growth to reduce the size of the grains in the source contact layer 180. It will also be appreciated that both the continuous grain stop layers and the discontinuous grain stop layers may be implemented as multilayer structures. In some embodiments, the multilayer grain stop layer may include one or more continuous layers as well as one or more discontinuous layers that are directly stacked.

It will also be appreciated that the buried grain stop layers disclosed herein may be used in power semiconductor devices other than vertical power MOSFET devices. For example, these grain stop layers may also be used in power IGBT devices, which, as known to those skilled in the art are the combination of a BJT and a MOSFET that feeds the base of the BJT in order to turn the BJT from a current controlled device into a voltage controlled device.

Figure 9A:
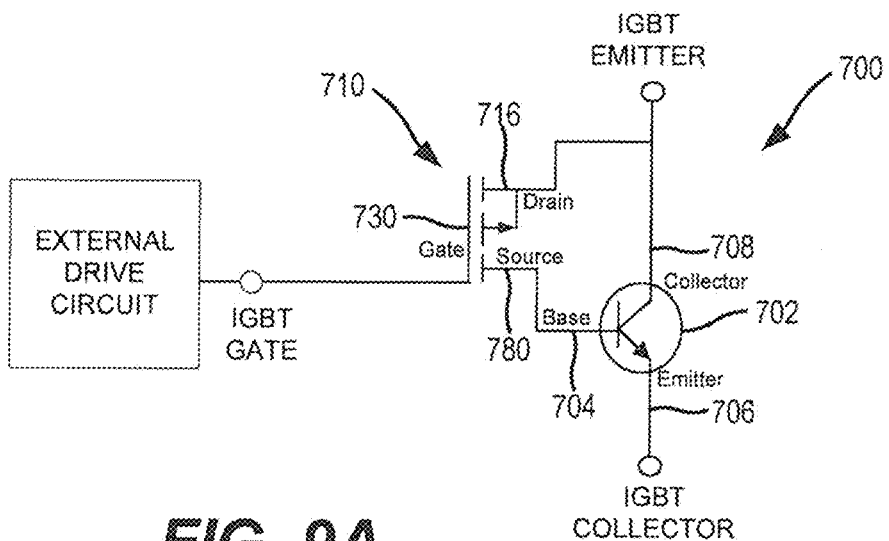
FIG. 9A is a simplified circuit diagram of an n-channel IGBT according to embodiments of the present invention.
Figure 9B:
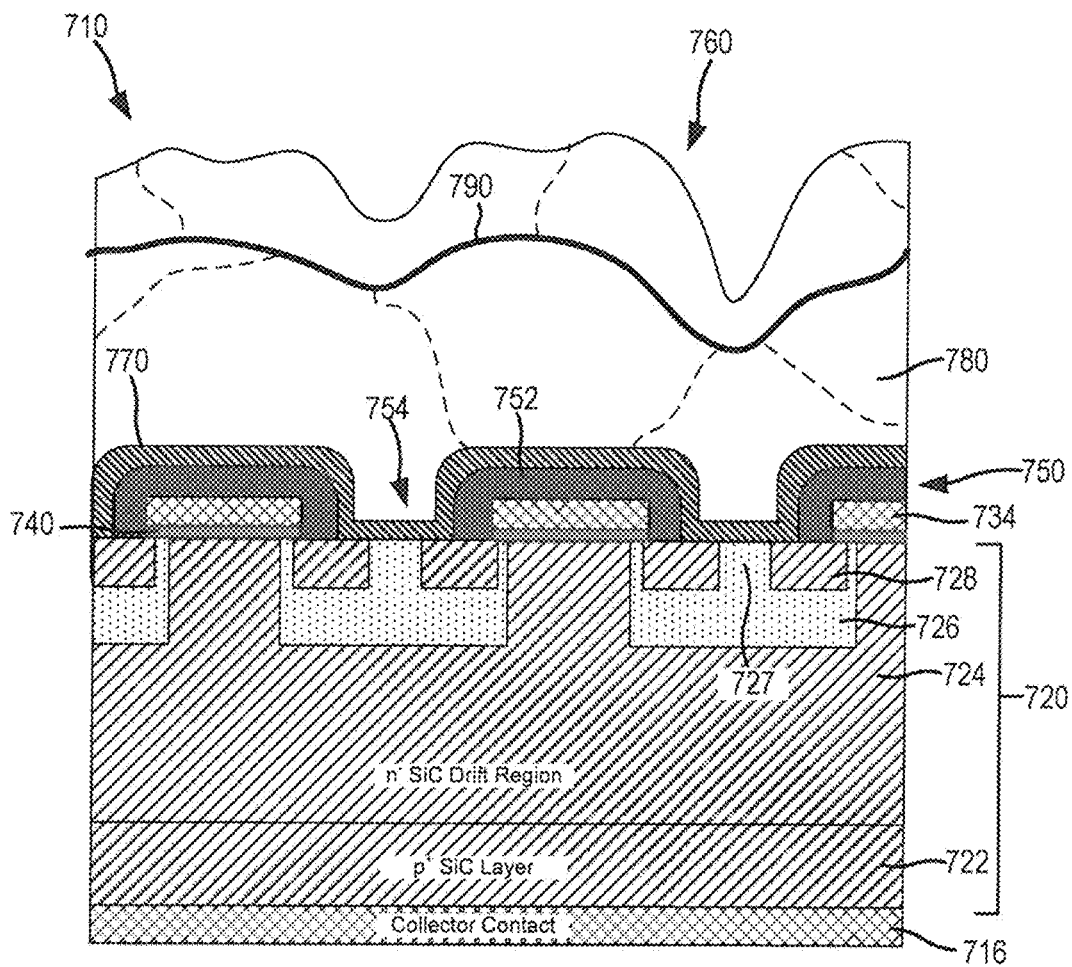
FIG. 9B is a schematic cross-sectional diagram of a pair of unit cells of the IGBT of FIG. 9A.

FIG. 9A is a simplified circuit diagram of an IGBT 700 according to embodiments of the present invention. FIG. 9B is a schematic cross-sectional diagram of the IGBT 700 of FIG. 9A.

As shown in FIG. 9A, the IGBT 700 includes an p-n-p silicon carbide BJT 702 that has a base 704, an emitter 706 and a collector 708. The IGBT 700 further includes a silicon carbide MOSFET 710 having a gate 730, a source 780 and a drain 716. The source 780 of the MOSFET 710 is electrically connected to the base 704 of the BJT 702, and the drain 716 of the silicon carbide MOSFET 710 is electrically connected to the collector 708 of the BJT 702. By convention, the collector 708 of the BJT 702 is the "emitter" of the IGBT 700, and the emitter 706 of the BJT 702 is the "collector" of the IGBT 700, and the gate 730 of the MOSFET 710 is the "gate" of the IGBT 700.

FIG. 9B is a schematic cross-sectional diagram of a portion of pair of unit cells of the IGBT 700 of FIG. 9A. As shown in FIG. 9B, the IGBT 700 may be formed on, for example, a heavily-doped ($p^+$) p-type silicon carbide layer 722. The p-type layer 722 may, for example, be epitaxially grown on a silicon carbide substrate and the substrate may thereafter be removed. The $p^+$ layer 722 acts as the collector of the IGBT 700 (and hence also as the emitter 706 of the BJT 702). A lightly-doped n-type ($n^-$) silicon carbide drift region 724 (which may optionally include a moderately-doped n-type silicon carbide current spreading layer in an upper portion thereof) is provided on the p-type layer 722. The n-type drift region 724 acts as the base of the BJT 702 and as the source of the MOSFET 710. Moderately-doped p-type well regions 726 are provided in the upper portion of the n-type drift region 724. An upper portion of each p-well 726 may be more heavily doped with p-type dopants to form a heavily-doped $p^+$ emitter region 727 which also acts as the collector of the BJT 702). Heavily-doped ($n^+$) n-type drain regions 728 may be formed in upper portions of each p-well 726 on opposed sides of the heavily-doped p-type emitter regions 727. The $n^+$ drain regions 728 act as a common drain for the IGBT 700. An ohmic contact 780 is formed to contact both the p-type well regions 726 and the $n^+$ drain regions 728, and an ohmic contact 716 is formed on the lower side of the $p^+$ silicon carbide layer 722.

A gate insulating pattern 740 is provided on the upper surface of the semiconductor layer structure 720, and gate fingers 734 are formed on the gate insulating pattern 740. The edge regions of the p-type well regions 726 that are directly underneath the gate insulating pattern 740 comprise channel regions that electrically connect the n-type source regions 728 to the n-type drift region 724 when a sufficient bias voltage is applied to the gate fingers 734. The gate contact 730 may be electrically connected to each gate finger 734.

An inter-metal dielectric pattern 750 is formed that includes a plurality dielectric fingers 752 that cover the respective gate fingers 734. The inter-metal dielectric pattern 750 may be identical to the inter-metal dielectric pattern 150 that is discussed above and hence further description thereof will be omitted. Gaps 754 are provided between adjacent dielectric fingers 752 that expose he n-type source regions 728 and the p-type well regions 726. A top-side source metallization structure 760 is formed on the inter-metal dielectric pattern 750 and on the exposed n-type source regions 728 and p-type well regions 726. The top-side metallization structure 760 includes a conductive diffusion barrier layer 770, the ohmic contact layer 780 and a grain stop layer 790 that is buried within the source contact layer 780. The top-side metallization structure 760 may be identical to any of the above-described top-side source metallization structures, except that the top-side metallization structure 760 may serve as an emitter contact as opposed to as a source contact, and may include any appropriate number and/or type of grain stop layer.

In addition to IGBTs, the buried grain stop layers according to embodiments of the present invention may be used, for example, in p-n diodes, Gate Turn-Off Thyristors ("GTOs"), MOS-controlled thyristors and various other power semiconductor devices. The techniques may likewise be used in RF transistor amplifiers such as gallium nitride based high power high electron mobility transistor ("HEMT") amplifiers. Thus, it will be appreciated that the top-side metallization structures according to embodiments of the present invention such as structures 160, 260, 360, 460, 560, 760 may be used on any appropriate semiconductor device and not just on MOSFETs, IGBTs and the like.

As discussed above, the buried grain stop layers according to embodiments of the present invention may be included in power semiconductor devices that are formed in wide bandgap semiconductor devices. Examples of the types of wide bandgap semiconductor devices that the buried grain stop layers according to embodiments of the present invention may be used in include silicon carbide, gallium nitride, and gallium oxide based devices, as well as a wide variety of II-VI compound semiconductor devices.

Figure 8:
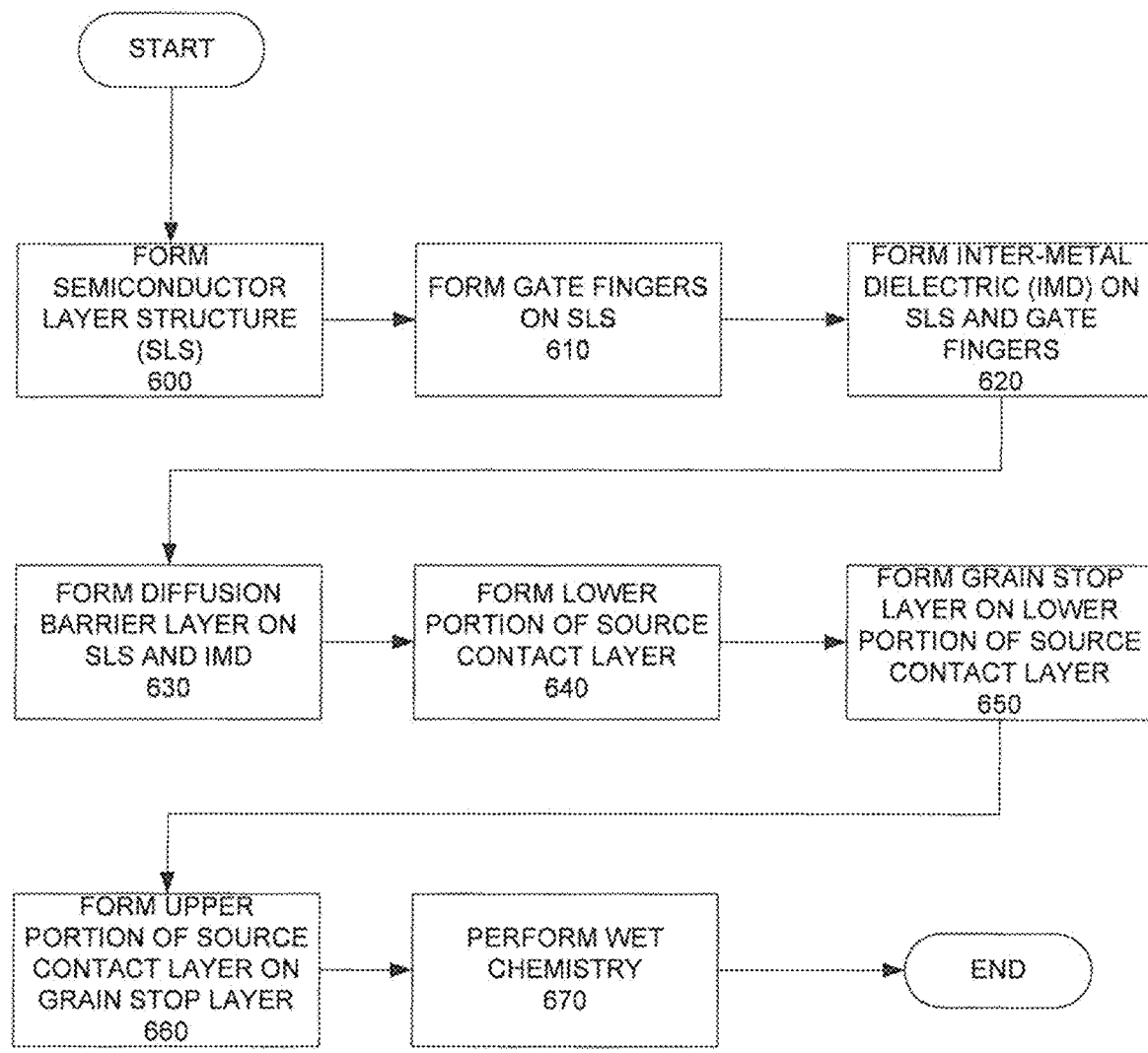
FIG. 8 is a flow chart of a method of forming a power MOSFET according to embodiments of the present invention.

FIG. 8 is a flow chart of a method of forming a power semiconductor device according to embodiments of the present invention. As shown in FIG. 8, operations may begin with the formation of a wide bandgap semiconductor layer structure that includes a plurality of semiconductor layers (Block 600). Next, a plurality of gate fingers are formed on an upper surface of the wide bandgap semiconductor layer structure (Block 610). An inter-metal dielectric pattern is formed on the gate fingers, the inter-metal dielectric pattern including a plurality of dielectric fingers that cover the respective gate fingers, the inter-metal dielectric pattern including openings that expose an upper surface of the wide bandgap semiconductor layer structure (Block 620). A first conductive diffusion barrier layer is formed on the inter-metal dielectric pattern and on the exposed upper surface of the wide bandgap semiconductor layer structure (Block 630). A first portion of a source contact layer is formed on an upper surface of the first conductive diffusion barrier layer, the first portion of the source contact layer comprising a first material (Block 640). A grain stop layer is formed on the first portion of the source contact layer (Block 650). The grain stop layer may be any of the above described grain stop layers. A second portion of the source contact layer is formed on an upper surface of the grain stop layer, the second portion of the source contact layer comprising the first material (Block 660). Finally, a process that includes wet etchants is performed on the second portion of the source contact layer (Block 670). The process may comprise, for example, a plating process that is performed on an upper surface of the source contact layer.

The power MOSFETs and other semiconductor devices according to embodiments of the present invention may have more robust top-side metallization that better resist ingress of wet etchants or other materials that might otherwise diffuse through the top-side metallization and generate electrical short circuits within the device. Moreover, the top-side metallization may have smaller grain sizes that may be better suited for subsequent processes such as plating processes that may be performed on the top-side metallization.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, That which is claimed is:

1. A semiconductor device, comprising:
a wide bandgap semiconductor layer structure;
a top-side metallization on an upper surface of the wide bandgap semiconductor layer structure, the top-side metallization including:
a first conductive diffusion barrier layer on the upper surface of the wide bandgap semiconductor layer structure;
a conductive contact layer on an upper surface of the first conductive diffusion barrier layer; and
a grain stop layer within the conductive contact layer.

2. The semiconductor device of claim 1, further comprising:
a plurality of gate fingers extending on the wide bandgap semiconductor layer structure; and
an inter-metal dielectric pattern on the gate fingers, the inter-metal dielectric pattern including a plurality of dielectric fingers that cover the respective gate fingers, the inter-metal dielectric pattern including openings.

3. The semiconductor device of claim 2, wherein the semiconductor device comprises a MOSFET, a plurality of source regions are provided in the semiconductor layer structure, wherein the conductive contact layer is a source contact layer on a first side of the semiconductor layer structure and is electrically connected to the source regions, the semiconductor device further comprising a drain contact on a second side of the semiconductor layer structure that is opposite the first side.

4. The semiconductor device of claim 3, wherein the grain stop layer comprises a second conductive diffusion barrier layer.

5. The semiconductor device of claim 3, wherein the grain stop layer is buried within an upper 30% of the source contact layer.

6. The semiconductor device of claim 3, wherein the grain stop layer divides the source contact layer into a lower portion and an upper portion, and wherein both the lower portion and the upper portion of the source contact layer have an average thickness of at least 2.0 microns and are formed of the same material(s).

7. The semiconductor device of claim 3, wherein an average thickness of a lower portion of the source contact layer that is beneath the grain stop layer is at least 0.5 microns.

8. The semiconductor device of claim 1, wherein the grain stop layer comprises a metal oxide layer.

9. The semiconductor device of claim 1, wherein the grain stop layer comprises a first grain stop layer, the semiconductor device further comprising a second grain stop layer buried within the conductive contact layer.

10. The semiconductor device of claim 1, wherein the grain stop layer is within an upper half of the conductive contact layer.

11. The semiconductor device of claim 1, wherein the grain stop layer includes a metal that is different than any metal in the conductive contact layer.

12. The semiconductor device of claim 11, wherein the conductive contact layer includes aluminum and the grain stop layer includes titanium.

13. The semiconductor device of claim 1, wherein an upper portion of the conductive contact layer includes a plurality of keyholes.

14. A semiconductor device, comprising:
a wide bandgap semiconductor layer structure having a plurality of source regions in an upper surface thereof;
a plurality of gate fingers extending on the wide bandgap semiconductor layer structure;
a contact layer on the wide bandgap semiconductor layer structure; and
a grain stop layer within the contact layer, the grain stop layer having a non-planar upper surface,
wherein the grain stop layer divides the contact layer into a lower portion and an upper portion, and wherein both the lower portion and the upper portion of the contact layer are formed of the same material(s).

15. The semiconductor device of claim 14, further comprising:
an inter-metal dielectric pattern on the gate fingers, the inter-metal dielectric pattern including a plurality of dielectric fingers that cover the respective gate fingers, the inter-metal dielectric pattern including openings.

16. The semiconductor device of claim 15, wherein the grain stop layer is a conductive diffusion barrier layer.

17. The semiconductor device of claim 16, wherein the conductive diffusion barrier layer comprises a second conductive diffusion barrier layer, the semiconductor device further comprising a first conductive diffusion barrier layer that is conformally formed on the inter-metal dielectric pattern and on the semiconductor layer structure so that the first conductive diffusion barrier layer is between the inter-metal dielectric pattern and the contact layer.

18. The semiconductor device of claim 16, wherein the conductive diffusion barrier layer is buried within an upper 30% of the contact layer.

19. The semiconductor device of claim 16, wherein at least portions of the conductive diffusion barrier layer are within 1 micron from an upper surface of the contact layer.

20. The semiconductor device of claim 14, wherein an average thickness of the lower portion of the contact layer that is beneath the grain stop layer is at least 0.5 microns.

21. The semiconductor device of claim 14, wherein the grain stop layer includes a metal that is different than any metal in the contact layer.

22. The semiconductor device of claim 21, wherein the contact layer includes aluminum.

23. The semiconductor device of claim 14, wherein the upper portion of the contact layer includes a plurality of keyholes.

24. A method of fabricating a semiconductor device, the method comprising:
forming a wide bandgap semiconductor layer structure;
forming a metal pattern on an upper surface of the wide bandgap semiconductor layer structure;
forming an inter-metal dielectric pattern on the metal pattern;
forming a first portion of a contact layer on an upper surface of the inter-metal dielectric pattern, the first portion of the contact layer comprising a first material;
forming a grain stop layer on the first portion of the contact layer; and
forming a second portion of the contact layer on an upper surface of the grain stop layer, the second portion of the contact layer comprising the first material,
wherein an upper surface of the contact layer includes a plurality of keyholes.

25. The method of claim 24, wherein an average thickness of the first portion of the contact layer is at least 0.5 microns.

26. The method of claim 25, wherein the grain stop layer includes a metal that is different than any metal in the contact layer.

27. A method of fabricating a semiconductor device, the method comprising:
- forming a wide bandgap semiconductor layer structure;
- forming a metal pattern on an upper surface of the wide bandgap semiconductor layer structure;
- forming an inter-metal dielectric pattern on the metal pattern;
- forming a first portion of a contact layer on an upper surface of the inter-metal dielectric pattern, the first portion of the contact layer comprising a first material;
- forming a grain stop layer on the first portion of the contact layer; and
- forming a second portion of the contact layer on an upper surface of the grain stop layer,
- wherein forming the grain stop layer on the first portion of the contact layer comprises interrupting growth of the contact layer in order to allow an upper surface of the first portion of the contact layer to oxidize.

28. The method of claim 27, wherein the second portion of the contact layer comprises the first material.

* * * * *

UNITED STATES PATENT AND TRADEMARK OFFICE
CERTIFICATE OF CORRECTION

PATENT NO. : 10,847,647 B2
APPLICATION NO. : 16/353313
DATED : November 24, 2020
INVENTOR(S) : Sabri et al.

It is certified that error appears in the above-identified patent and that said Letters Patent is hereby corrected as shown below:

On the Title Page

Item (56) References Cited, OTHER PUBLICATIONS, Column 2: Please correct "PCT/U52020/018730" to read -- PCT/US2020/018730 --

In the Specification

Column 9, Line 53: Please correct "$1 \times 10^{th}$" to read -- $1 \times 10^{18}$ --

Column 10, Line 12: Please correct "n-type (n)" to read -- n-type (n⁻) --

Signed and Sealed this
Second Day of July, 2024

Katherine Kelly Vidal
*Director of the United States Patent and Trademark Office*